(12) United States Patent
Wang et al.

(10) Patent No.: US 12,131,979 B2
(45) Date of Patent: Oct. 29, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Luguang Wang, Hefei (CN); Xiaoling Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 288 days.

(21) Appl. No.: 17/648,565

(22) Filed: Jan. 21, 2022

(65) Prior Publication Data

US 2022/0384312 A1    Dec. 1, 2022

Related U.S. Application Data

(63) Continuation of application No. PCT/CN2021/120098, filed on Sep. 24, 2021.

(30) Foreign Application Priority Data

Jun. 1, 2021   (CN) .......................... 202110610990.0

(51) Int. Cl.
*H01L 23/48*       (2006.01)
*H01L 21/768*      (2006.01)
(Continued)

(52) U.S. Cl.
CPC ...... *H01L 23/481* (2013.01); *H01L 21/76898* (2013.01); *H01L 23/367* (2013.01);
(Continued)

(58) Field of Classification Search
CPC ............. H01L 23/481; H01L 21/76898; H01L 23/367; H01L 23/3736; H01L 21/7682;
(Continued)

(56) References Cited

U.S. PATENT DOCUMENTS 9,805,977 B1 * 10/2017 Sukumaran ....... H01L 21/76898
2012/0037969 A1 * 2/2012 Sanders .................. H01L 28/10
257/296
(Continued)

FOREIGN PATENT DOCUMENTS

CN        103515302 A      1/2014
CN        111769087 A      10/2020
(Continued)

OTHER PUBLICATIONS

International Search Report cited in PCT/CN2021/120098 mailed Jan. 28, 2022, 9 pages.

*Primary Examiner* — Patricia D Valenzuela
(74) *Attorney, Agent, or Firm* — Syncoda LLC; Feng Ma (57) ABSTRACT

The present disclosure provides a semiconductor structure and a manufacturing method thereof. The semiconductor structure includes: a base, the base including a substrate and a first heat dissipation structure located in the substrate, heat conductivity of the first heat dissipation structure being higher than that of the substrate, the substrate including an upper surface and a lower surface opposite to each other, and a surface of the first heat dissipation structure being exposed on the upper surface of the substrate; a second heat dissipation structure, the second heat dissipation structure being at least located on an upper surface of the first heat dissipation structure; and a through silicon via (TSV) structure, the TSV structure penetrating through an entire thickness of the second heat dissipation structure and extending into the base, the second heat dissipation structure surrounding the TSV structure, and the first heat dissipation structure surrounding the TSV structure.

14 Claims, 5 Drawing Sheets

(51) Int. Cl.
*H01L 23/367* (2006.01)
*H01L 23/373* (2006.01)
*H01L 21/308* (2006.01)

(52) U.S. Cl.
CPC ...... *H01L 23/3736* (2013.01); *H01L 21/3083* (2013.01); *H01L 21/76802* (2013.01)

(58) Field of Classification Search
CPC ........... H01L 23/3677; H01L 21/76802; H01L 21/3083
See application file for complete search history.

(56) References Cited

U.S. PATENT DOCUMENTS

2016/0155686 A1* 6/2016 Lee .................... H01L 23/5226
 257/737
2021/0111101 A1 4/2021 Howard

FOREIGN PATENT DOCUMENTS

| CN | 111834306 A | 10/2020 |
| CN | 112466846 A | 3/2021 |

\* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2021/120098, filed on Sep. 24, 2021, which is based on and claims the priority to Chinese Patent Application No. 202110610990.0, titled "SEMICONDUCTOR STRUCTURE AND MANUFACTURING METHOD THEREOF" and filed on Jun. 1, 2021. The entire contents of International Application No. PCT/CN2021/120098 and Chinese Patent Application No. 202110610990.0 are herein incorporated into the present disclosure by reference.

TECHNICAL FIELD

The present disclosure relates to, but is not limited to, a semiconductor structure and a manufacturing method thereof.

BACKGROUND

The three-dimensional (3D) integration technology is a relatively advanced electronic packaging technology in the modern semiconductor industry. Wherein, the high-performance through silicon via (TSV) manufacturing technology is a key factor that restricts rapid development of the 3D integration technology.

A TSV structure is an integrated entity with high power consumption formed by stacking multiple layers of materials, which causes accumulation of much heat and difficulty in effectively discharging the heat. An excessively high heat flow density affects an electrical property of a chip, resulting in reduced reliability and stability of the TSV structure.

SUMMARY

An overview of the subject matter detailed in the present disclosure is provided below, which is not intended to limit the protection scope of the claims.

The present disclosure provides a semiconductor structure and a manufacturing method thereof.

A first aspect of the present disclosure provides a semiconductor structure, including: a base, the base including a substrate and a first heat dissipation structure located in the substrate, a heat conductivity of the first heat dissipation structure being higher than a heat conductivity of the substrate, the substrate comprising an upper surface and a lower surface opposite to each other, and a surface of the first heat dissipation structure being exposed on the upper surface of the substrate; a second heat dissipation structure, the second heat dissipation structure being at least located on an upper surface of the first heat dissipation structure; and a through silicon via structure, the through silicon via structure penetrating through an entire thickness of the second heat dissipation structure and extending into the base, the second heat dissipation structure surrounding the through silicon via structure, and the first heat dissipation structure surrounding the through silicon via structure.

A second aspect of the present disclosure further provides a method of manufacturing a semiconductor structure, including: providing an initial substrate and an initial dielectric layer located on an upper surface of the initial substrate; patterning the initial dielectric layer and the initial substrate, and forming a blind via, the blind via penetrating through an entire thickness of the initial dielectric layer and extending into the initial substrate; forming a through silicon via structure, the through silicon via structure fully filling the blind via; patterning the initial dielectric layer until the initial substrate is exposed, and forming an annular via surrounding the through silicon via structure, and the annular via being provided close to the through silicon via structure; performing a doping treatment on a part of the initial substrate right below the annular via, to convert the part of the initial substrate right below the annular via to a first heat dissipation structure, and using a remaining part of the initial substrate as a substrate, and a heat conductivity of the first heat dissipation structure being higher than a heat conductivity of the substrate; and forming a second heat dissipation structure, the second heat dissipation structure at least filling up the annular via.

Other aspects are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The accompanying drawings in the following description are part rather than all of the embodiments of the present disclosure. Those skilled in the art may derive other drawings based on these drawings without creative efforts.

DETAILED DESCRIPTION

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

The present disclosure provides a semiconductor structure. In the semiconductor structure, a part of a TSV structure located in a substrate is surrounded by a first heat dissipation structure, heat conductivity of the first heat dissipation structure is higher than that of the substrate, and the first heat conduction structure can effectively dissipate heat in the TSV structure. In addition, the remaining part of the TSV structure is surrounded by a second heat dissipation structure. The first heat dissipation structure and the second heat dissipation structure help to dissipate heat in the TSV structure, reducing the temperature of the TSV structure and improving the heat dissipation rate of the semiconductor structure.

The semiconductor structure provided in the embodiments of the present disclosure is described in detail below with reference to the drawings.

Figure 1:
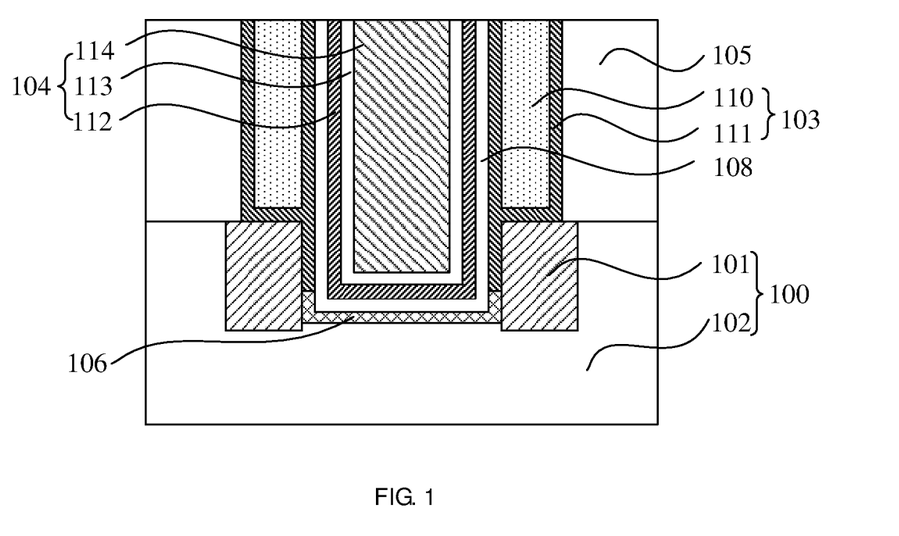
FIG. 1 is a sectional schematic structural diagram of a semiconductor structure according to an embodiment of the present disclosure.
Figure 2:
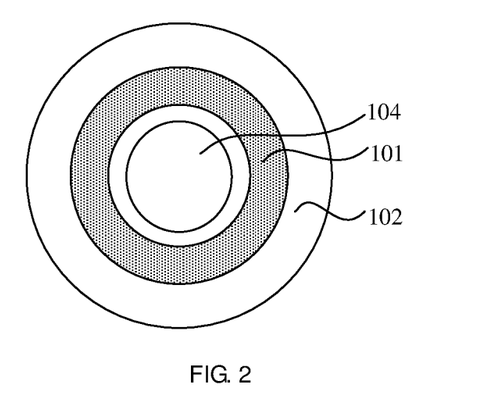
FIG. 2 is a top view of a semiconductor structure according to an embodiment of the present disclosure.

Referring to FIG. 1 and FIG. 2, the semiconductor structure includes: a base 100, the base 100 including a first heat dissipation structure 101 and a substrate 102, a heat conductivity of the first heat dissipation structure 101 being higher than that of the substrate 102, the substrate 102 including an upper surface and a lower surface opposite to each other, and a part of the structure of the first heat dissipation structure 101 being exposed on the upper surface of the substrate 102; a second heat dissipation structure 103, the second heat dissipation structure 103 being at least located on a surface of the first heat dissipation structure 101; and a TSV structure 104, the TSV structure 104 penetrating through an entire thickness of the second heat dissipation structure 103 and extending into the base 100, the second heat dissipation structure 103 surrounding the TSV structure 104, and the first heat dissipation structure 101 surrounding the TSV structure 104.

The embodiments of the present disclosure provide the semiconductor structure with a brand-new structure, which can be applied to memory circuits. The semiconductor structure includes the first heat dissipation structure 101 and the second heat dissipation structure 103. The first heat dissipation structure 101 is located inside the substrate 102, and the second heat dissipation structure 103 is located on the upper surface of the first heat dissipation structure 101. Both the first heat dissipation structure 101 and the second heat dissipation structure 103 surround the TSV structure 104, so that internal heat of the TSV structure 104 can be dissipated through the first heat dissipation structure 101 and the second heat dissipation structure 103, thereby reducing the internal heat of the TSV structure 104.

The semiconductor structure provided in the embodiments of the present disclosure is described in detail below with reference to the drawings.

The semiconductor structure may be a wafer, a chip, or a package structure. In some embodiments, the TSV structure 104 is used as a heat dissipation channel of the semiconductor structure. Correspondingly, the first heat dissipation structure 101 and the second heat dissipation structure 103 are disposed to help to improve the heat dissipation ability of the heat dissipation channel. In another embodiment, the TSV structure 104 may also be used as a conductive channel of the semiconductor structure, and the first heat dissipation structure 101 and the second heat dissipation structure 103 are disposed to facilitate heat dissipation of the conductive channel, to avoid overheat of the conductive channel, thereby improving the heat dissipation rate of the semiconductor structure.

The TSV structure 104 may also be a laminated structure. In some embodiments, the TSV structure 104 includes: a conductor layer 114, the conductor layer 114 penetrating through the entire thickness of the second heat dissipation structure 103 and extending into the base; a seed layer 113, the seed layer 113 being located on a side surface and a bottom surface of the conductor layer 114; and a barrier layer 112, the barrier layer 112 being located on a surface of the seed layer 113 and away from the conductor layer 114.

For example, a material of the conductor layer 114 may be Cu, Al, or W. Generally, the conductor layer 114 may be formed through an electroplating process, the seed layer 113 is used as an electroplating seed layer of the electroplating process, and a material of the seed layer 113 may be the same as that of the conductor layer 114. The barrier layer 112 is configured to prevent a metal ion in the conductor layer 114 from diffusing into the substrate 102, and further may be configured to improve adhesion between the substrate 102 and the seed layer 113. In some embodiments, a material of the barrier layer 112 may be at least one of Ta, Ti, TaN, or TiN. In addition, in other embodiments, the TSV structure 104 may also only include the barrier layer 112 and the conductor layer 114.

It can be understood that in other embodiments, the TSV structure may be a single-layer structure and may be a conductor layer, and a material of the conductor layer may be Cu, Al, or W, or the like. In addition, the first heat dissipation structure may be in direct contact with the surface of the TSV structure, and the second heat dissipation structure may be in direct contact with the surface of the TSV structure.

In some embodiments, the substrate 102 is a semiconductor substrate, that is, the substrate 102 is formed by a semiconductor element, and the semiconductor element may be at least one of silicon or germanium. The semiconductor element further may include carbon. Correspondingly, the substrate 102 may be a semiconductor substrate such as a silicon substrate, a germanium substrate, a silicon germanium substrate, or a silicon carbide substrate. The substrate 102 may include active areas (AA) and shallow trench isolation structures for isolating adjacent active areas.

In some embodiments, the first heat dissipation structure 101 and the substrate 102 include a same semiconductor element. In other words, the first heat dissipation structure 101 may be formed by doping the substrate 102. In this way, the first heat dissipation structure 101 has higher heat conductivity than that of the substrate 102, which helps to improve the heat dissipation ability. In addition, the first heat dissipation structure 101 and the substrate 102 may be an integral structure, which helps to reduce manufacturing costs.

In some embodiments, the first heat dissipation structure 101 is a non-oxide including a semiconductor element, that is, the first heat dissipation structure 101 is not an oxide, and the oxide is, for example, silicon oxide. Therefore, non-oxide is used around the TSV structure 104 to achieve electrical isolation from the substrate 102, so that a metal-oxide-semiconductor (MOS) capacitor is not generated. Therefore, this prevents the MOS capacitor from coupling a signal of the TSV structure 104 to the substrate 102 or a surrounding device, thereby avoiding signal distortion and leakage current and helping to reduce static power consumption. In related technologies, an oxide layer is generally used around the TSV structure to achieve electrical isolation from the substrate. This creates a MOS capacitor. The MOS capacitor couples a signal of the TSV structure to the substrate or a surrounding device such as a surrounding TSV structure, thereby causing signal distortion or a leakage current and increasing static power consumption.

In some embodiments, a material of the first heat dissipation structure 101 may be silicon carbide. In some other examples, the material of the first heat dissipation structure 101 may also be metal silicide. In addition, a metal element in the metal silicide may be Ni, Al, W, or Ti, and correspondingly, the metal silicide may be nickel silicide, aluminum silicide, tungsten silicide, or titanium silicide. Both silicon carbide and metal silicide have high heat conductivity and good thermal conducting effects.

It can be understood that, in other embodiments, the material of the substrate is germanium, and the material of the first heat dissipation structure may be germanium carbide or metal germanide.

Figure 3:
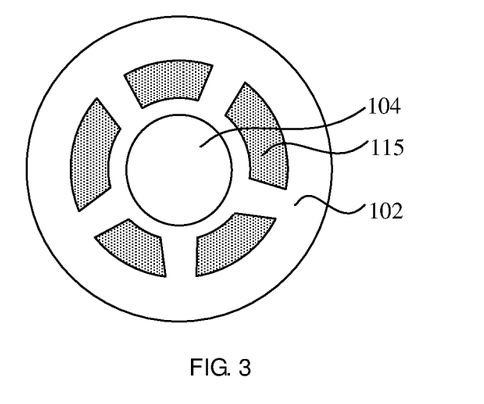
FIG. 3 is another sectional schematic structural diagram of a semiconductor structure according to an embodiment of the present disclosure.

FIG. 2 and FIG. 3 are several different top view schematic structural diagrams of semiconductor structures. For ease of illustration and description, the second heat dissipation structure is not shown in FIG. 2 and FIG. 3.

Referring to FIG. 2, in some embodiments, the first heat dissipation structure 101 is a closed ring structure, and is disposed around the TSV structure 104. Referring to FIG. 3, in some other embodiments, the first heat dissipation structure 101 may include multiple first heat dissipation blocks 115 separated from each other, the multiple first heat dissipation blocks 115 separated from each other are disposed around the TSV structure 104, and adjacent first heat dissipation blocks 115 are separated from each other by a part of the substrate 102.

In addition, to further improve the heat dissipation effect of the first heat dissipation structure 101 on the TSV structure 104, a length of the first heat dissipation structure 101 extending in the substrate 102 may be greater than or equal to that of the TSV structure 104 extending in the substrate 102. To be specific, a distance between the lower surface and a bottom surface of the first heat dissipation structure 101 facing the lower surface is a first distance, a distance between the lower surface and a bottom surface of the TSV structure 104 facing the lower surface is a second distance, and the first distance is smaller than or equal to the second distance.

It can be understood that, in other embodiments, the length of the first heat dissipation structure extending in the substrate may also be less than that of the TSV structure extending in the substrate, that is, the first distance is larger than the second distance.

In some embodiments, a heat conductivity of the second heat dissipation structure 103 is higher than that of the first heat dissipation structure 101, and a material of the second heat dissipation structure 103 may be a single metal or a metal alloy. Further, a material of the second heat dissipation structure 103 may be at least one of W, Ag, Au, Pt, Al, Co, Ni, or Ru.

In some embodiments, the second heat dissipation structure 103 further may be located between the first heat dissipation structure 101 and the TSV structure 104, that is, at least a part of area of the TSV structure 104 in the substrate 102 is in contact with the second heat dissipation structure 103. Compared with the solution in which a part of the TSV structure 104 in the substrate 102 is in contact with the first heat dissipation structure 101, because the heat conductivity of the second heat dissipation structure 103 is higher than that of the first heat dissipation structure 101, the heat dissipation effect of the part of the TSV structure 104 in the substrate 102 can be further improved.

It can be understood that in some other embodiments, the first heat dissipation structure may also be in direct contact with the TSV structure.

The second heat dissipation structure 103 may be a closed ring structure, and is disposed around the TSV structure 104. In addition, the second heat dissipation structure 103 may also include second heat dissipation blocks separated from each other, the second heat dissipation blocks separated from each other are disposed around the TSV structure 104, and adjacent second heat dissipation blocks are separated from each other by a dielectric layer.

In some embodiments, the second heat dissipation structure 103 may be located on the entire upper surface of the first heat dissipation structure 101. In other embodiments, the second heat dissipation structure may also be located on a part of an upper surface of the first heat dissipation structure. That is, the second heat dissipation structure does not cover a part of the upper surface of the first heat dissipation structure, and the part of the upper surface that is not covered by the second heat dissipation structure may be covered by the dielectric layer.

The semiconductor structure further may include: a dielectric layer 105, the dielectric layer 105 being located on the upper surface of the substrate 102; and a buffer layer 106, the buffer layer 106 being at least located on a bottom surface of the TSV structure 104 and facing the lower surface of the substrate 102.

In some embodiments, the dielectric layer 105 further may be located on a part of the upper surface of the first heat dissipation structure 101. The second heat dissipation structure 103 is located on a side surface of the dielectric layer 105 and facing the TSV structure 104; and a material of the dielectric layer 105 may be an insulating material such as silicon oxide, silicon nitride, or silicon oxynitride.

The buffer layer 106 has the following functions: On the one hand, the buffer layer 106 may be used as a transition layer between the substrate 102 and the TSV structure 104 and has a stress relief effect; on the other hand, the buffer layer 106 further can improve adhesion between the substrate 102 and the TSV structure 104.

Figure 4:
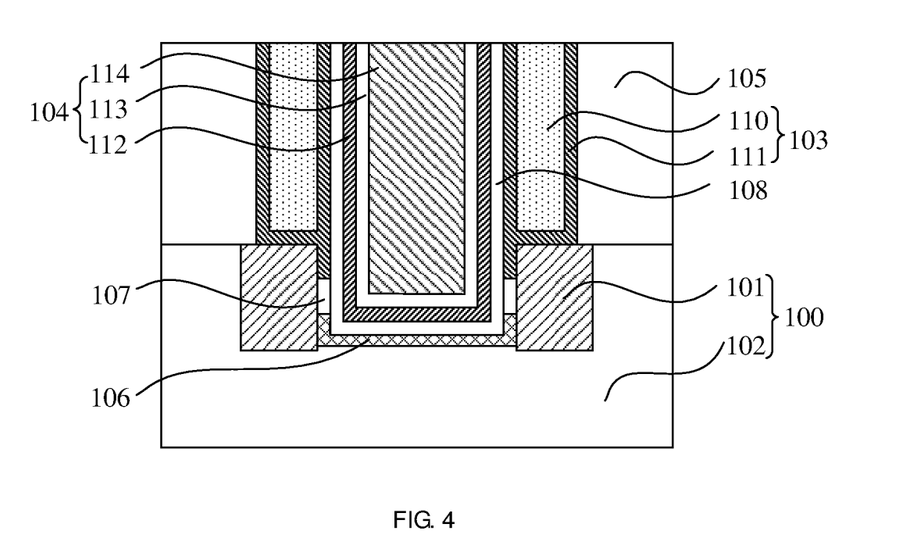
FIG. 4 is yet another sectional schematic structural diagram of a semiconductor structure according to an embodiment of the present disclosure.

In some embodiments, referring to FIG. 4, in addition to being located on the bottom surface of the TSV structure 104, the buffer layer 106 may be further located on a part of a side surface of the TSV structure 104 and located in the substrate 102. Correspondingly, the first heat dissipation structure 101 is in contact with the buffer layer 106. In addition, the semiconductor structure further may include: a hollow area enclosed by the second heat dissipation structure 103, the first heat dissipation structure 101, the buffer layer 106, and the TSV structure 104. The hollow area may be used as a heat dissipation area.

In some other embodiments, referring to FIG. 1, the buffer layer 106 further may be located on an entire side surface of the TSV structure 104, wherein the entire side surface may refer to an entire side surface of a part of the TSV structure 104 in the substrate 102, or may refer to an entire side surface of a part of the TSV structure 104 in the substrate 102 and the dielectric layer 105. The material of the buffer layer 106 may be silicon oxide.

In some other embodiments, the buffer layer 106 does not cover a part of a side surface of the first heat dissipation structure 101 and facing the TSV structure 104, and the second heat dissipation structure 103 may include: a thermally conductive metal layer 111, the thermally conductive metal layer 111 being located on an upper surface of the first heat dissipation structure 101, being further located on a side surface of the dielectric layer 105 and facing the TSV structure 104, and being further located on a side surface of the TSV structure 104, and being further located on at least a part of the side surface of the first heat dissipation structure 101, facing the TSV structure 104, and being not covered by the buffer layer 106; and a metal particle layer 110, an area enclosed by the thermally conductive metal layer 111 being fully filled with the metal particle layer 110.

The thermally conductive metal layer 111 may be a film layer formed through a deposition process. In some embodiments, as shown in FIG. 1, the TSV structure 104, the first heat dissipation structure 101, and the buffer layer 106 enclose and form a hollow area, and the hollow area is fully filled with the thermally conductive metal layer 111. In this way, both the part of the TSV structure 104 located in the substrate 102 and the first heat dissipation structure 101 are in contact with the thermally conductive metal layer 111, and a heat conductivity of the thermally conductive metal layer 111 is higher than the heat dissipation rate of the first heat dissipation structure 101, which helps to further improve the heat dissipation effect of the part of the TSV structure 104 in the substrate 102.

In some other embodiments, as shown in FIG. 4, the thermally conductive metal layer 111 does not cover a part of a sidewall surface of the first heat dissipation structure 101 and facing the TSV structure 104, and the TSV structure 104, the first heat dissipation structure 101, the buffer layer 106, and the thermally conductive metal layer 111 enclose and form a gap 107. In this way, a part of the thermally conductive metal layer 111 in the substrate 102 may be used as a heat conducting channel, and the gap 107 may also be used as a heat dissipation area. This helps to further improve the heat dissipation effect of the part of the TSV structure 104 in the substrate 102. In addition, during the operation of the semiconductor structure, the TSV structure 104 expands or contracts due to thermal stress, and the gap 107 is disposed to help to eliminate stress deformation applied by the TSV structure 104 to the substrate 102 or the dielectric layer 105, thereby preventing the substrate 102 or the dielectric layer 105 from being deformed.

A material of the thermally conductive metal layer 111 may be at least one of W, Ag, Au, Pt, Al, Co, Ni, or Ru.

It can be understood that, in other embodiments, the thermally conductive metal layer 111 may also be located only above the first heat dissipation structure 101.

The metal particle layer 110 may be a film layer formed through a spin coating process. In some embodiments, a particle size of the metal particle layer 110 may be larger than that of the thermally conductive metal layer 111.

A material of the metal particle layer 110 may be W, Ag, Au, Pt, Al, Co, Ni, or Ru. In addition, in some embodiments, the material of the metal particle layer 110 may be the same as that of the thermally conductive metal layer 111. In some other embodiments, the material of the metal particle layer 110 may also be different from that of the thermally conductive metal layer 111.

A dual-film-layer structure including the thermally conductive metal layer 111 and the metal particle layer 110 is used as the second heat dissipation structure 103. On the one hand, the thermally conductive metal layer 111 may be formed through the deposition process, so that the thermally conductive metal layer 111 can be more easily formed between the first heat dissipation structure 101 and the TSV structure 104. And the metal particle layer 110 may be formed through a spin coating process. Compared with the deposition process, the metal particle layer 110 can be formed faster through the spin coating process, and the problem of premature sealing in the deposition process can be avoided.

A width of a part of the thermally conductive metal layer 111 located in the substrate 102 ranges from 100 nm to 300 nm, for example, 150 nm, 200 nm, or 250 nm. The width is a width in a direction in which the first heat dissipation structure 101 points to the TSV structure 104. Within this range, the thermally conductive metal layer 111 can form a condensed sealing structure during the deposition process, to well seal an opening area between the first heat dissipation structure 101 and the TSV structure 104, that is, the thermally conductive metal layer 111 can achieve a good sealing effect. It can be understood that in other embodiments, the second heat dissipation structure may also be a single-film-layer structure.

In some embodiments, the semiconductor structure further may include: a third heat dissipation structure 108, the third heat dissipation structure 108 being located on a side surface of the TSV structure 104, and a heat conductivity of a material of the third heat dissipation structure 108 being higher than that of a material of the TSV structure 104. In other words, the third heat dissipation structure 108 is located between the first heat dissipation structure 101 and the TSV structure 104, and further is located between the second heat dissipation structure 103 and the TSV structure 104. One surface of the third heat dissipation structure 108 is in contact with the TSV structure 104, and a part of area of the other surface of the third heat dissipation structure 108 is in contact with the second heat dissipation structure 103. The third heat dissipation structure 108 is disposed to further increase a heat dissipation channel of the semiconductor structure, thereby further improving the heat dissipation effect of the semiconductor structure, to conduct heat in the TSV structure 104 faster.

In addition, the third heat dissipation structure 108 further may be located on the bottom surface of the TSV structure 104 facing the lower surface, that is, the third heat dissipation structure 108 is a U-shaped structure surrounding the TSV structure 104. In addition, when the semiconductor structure includes the buffer layer 106, the third heat dissipation structure 108 further is located between the buffer layer 106 and the TSV structure 104.

The third heat dissipation structure 108 may be a single metal film layer or a metal compound film layer. For example, a material of the third heat dissipation structure 108 may be at least one of Co, W, Ag, Au, Pt, Ni, Al, TiN, or Ru. In addition, a width of the thermally conductive metal layer 111 may be smaller than that of the third heat dissipation structure 108. In some embodiments, a thickness of the third heat dissipation structure 108 may range from 100 nm to 500 nm, such as 200 nm, to ensure an expected heat dissipation effect.

In the semiconductor structure provided in the embodiments of the present disclosure, because the first heat dissipation structure 101 and the second heat dissipation structure 103 are specially disposed, heat generated in the TSV structure 104 can be effectively dissipated in time, to avoid an increase in the working temperature of the semiconductor structure, improve the heat dissipation effect, and avoid excessive heat density, thereby improving reliability and stability of the semiconductor structure.

In addition, there is the first heat dissipation structure 101 between the substrate 102 and the TSV structure 104, so that a MOS capacitor is not formed between the substrate 102 and the TSV structure 104. Therefore, this prevents the MOS capacitor from coupling a signal to the substrate 102 or a surrounding device and the TSV structure, thereby avoiding signal distortion and a leakage current and helping to reduce power consumption.

In addition, the TSV structure 104 is separated from the dielectric layer 105 by the second heat dissipation structure 103. If the TSV structure 104 expands or contracts due to thermal stress, the second heat dissipation structure 103 is directly affected, instead of the dielectric layer 105. Therefore, this helps to avoid stress deformation of the dielectric layer 105 and prevent the semiconductor structure from being damaged.

The embodiments of the present disclosure further provide a method of manufacturing a semiconductor structure, which may be used to manufacture the above-mentioned semiconductor structure. The manufacturing method provided in the embodiments of the present disclosure will be described in detail below with reference to the drawings. It should be noted that the parts the same as or corresponding to those mentioned in the previous embodiment may be referred to the previous embodiment and will not be repeated here.

FIG. 5 to FIG. 12 are schematic structural diagrams corresponding to a method of manufacturing a semiconductor structure according to embodiments of the present disclosure.

Figure 5:
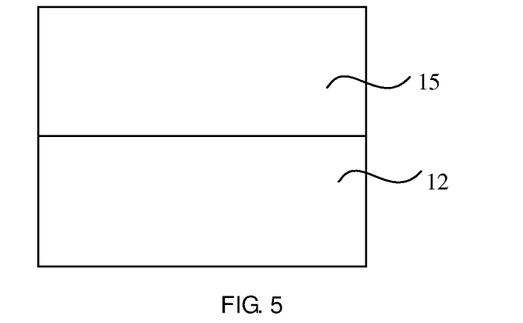
FIG. 5 is a schematic structural diagram of an initial substrate and an initial dielectric layer provided in a method of manufacturing a semiconductor structure according to an embodiment of the present disclosure.

As shown in FIG. 5, an initial substrate 12 and an initial dielectric layer 15 located on an upper surface of the initial substrate 12 are provided.

The initial substrate 12 provides a process basis for subsequent formation of a substrate, and the initial dielectric layer 15 provides a process basis for subsequent formation of a dielectric layer.

A material of the initial substrate 12 may be a semiconductor material, such as silicon, germanium, silicon germanium, or silicon carbide.

Figure 6:
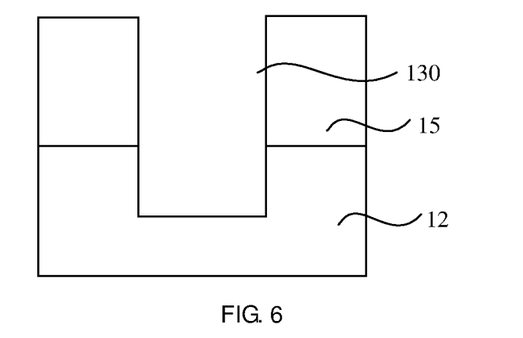
FIG. 6 is a schematic structural diagram of the structure shown in FIG. 5 after a blind via is formed.

As shown in FIG. 6, the initial dielectric layer 15 and the initial substrate 12 are patterned, and a blind via 130 is formed, wherein the blind via 130 penetrates through an entire thickness of the initial dielectric layer 15 and extends into the initial substrate 12.

The blind via 130 provides a process basis for subsequent formation of a TSV structure. In some embodiments, forming the blind via 130 may include: forming a patterned photoresist layer on a surface of the initial dielectric layer 15; using the patterned photoresist layer as a mask and etching the initial dielectric layer 15 through an anisotropic etching process until the initial substrate 12 is exposed; then, continuing to etch the initial substrate 12 along the pattern, until the blind via 130 with a preset depth is formed; and removing the patterned photoresist layer.

Figure 7:
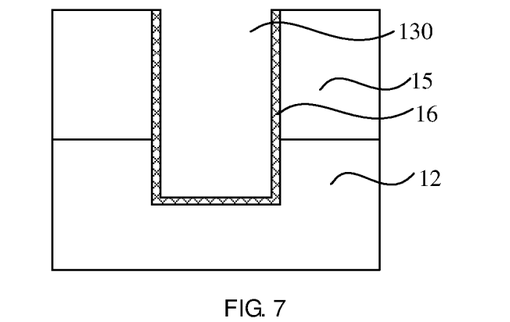
FIG. 7 is a schematic structural diagram of the structure shown in FIG. 6 after an initial buffer layer is formed.

Subsequent process includes: forming a TSV structure, the TSV structure filling the blind via, and then, for example, removing an underlying layer through a thinning process and forming a required TSV structure. In some embodiments, before the TSV structure is formed, a buffer layer further may be formed, and the buffer layer is located on a bottom surface of the blind via 130. In some embodiments, forming the buffer layer and the TSV structure includes:

Referring to FIG. 7, an initial buffer layer 16 is formed, and the initial buffer layer 16 covers the bottom and the side wall of the blind via 130.

In some embodiments, the initial buffer layer 16 provides a process basis for subsequent formation of the buffer layer.

A material of the initial buffer layer 16 may be silicon oxide, silicon nitride, and silicon oxynitride.

The initial buffer layer 16 should not be excessively thin or thick. If the initial buffer layer 16 is excessively thin, the stress buffer effect of the initial buffer layer 16 is limited. If the initial buffer layer 16 is excessively thick, this cannot meet the development trend of miniaturization of the semiconductor structure. In this embodiment, the thickness of the initial buffer layer 16 ranges from 100 nm to 300 nm, for example, 100 nm, 200 nm, or 250 nm. It should be noted that the thickness of the initial buffer layer 16 is a thickness in a direction parallel to the surface of the initial substrate 12 and perpendicular to the side wall of the blind via 130.

Figure 8:
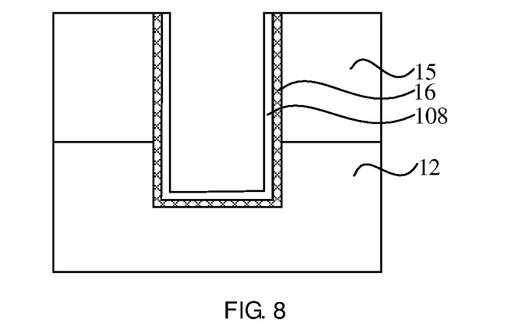
FIG. 8 is a schematic structural diagram of the structure shown in FIG. 7 after a third heat dissipation structure is formed.

As shown in FIG. 8, in some embodiments, the method further may include: forming a third heat dissipation structure 108 on the surface of the initial buffer layer 16. The heat conductivity of the third heat dissipation structure 108 is higher than that of the TSV structure formed subsequently.

In this embodiment, a thickness of the third heat dissipation structure 108 may range from 100 nm to 500 nm, such as 100 nm, 200 nm, 250 nm, or 300 nm. It should be noted that the thickness of the third heat dissipation structure 108 is a thickness in a direction parallel to the surface of the initial substrate 12 and perpendicular to the side wall of the blind via 130.

In this embodiment, the third heat dissipation structure 108 is located on the bottom and the side wall of the initial buffer layer 16. In other embodiments, the third heat dissipation structure may only be located on the side wall of the initial buffer layer.

Figure 9:
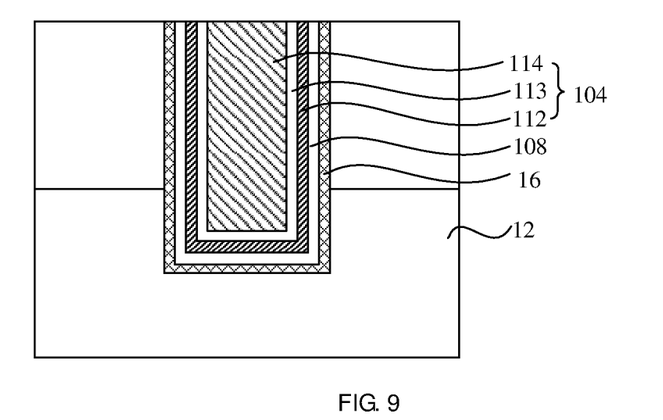
FIG. 9 is a schematic structural diagram of the structure shown in FIG. 8 after a TSV structure is formed.

As shown in FIG. 9, the TSV structure 104 is formed, and the blind via 130 is fully filled with the TSV structure 104 (refer to FIG. 8).

In some embodiments, forming the TSV structure 104 may include: forming a barrier layer 112 through a deposition process, the barrier layer 112 being located on a surface of the third heat dissipation structure 108; forming a seed layer 113 through a deposition process, the seed layer 113 being located on a surface of the barrier layer 112; and forming a conductor layer 114 through an electroplating process, the conductor layer 114 filling the blind via 130.

It can be understood that, in other embodiments, the TSV structure may also be a single-layer structure or a dual-layer structure including the barrier layer and the conductor layer.

Figure 10:
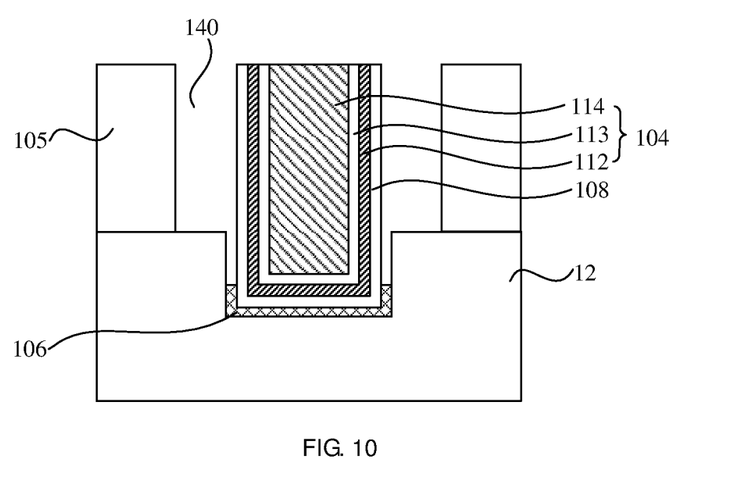
FIG. 10 is a schematic structural diagram of the structure shown in FIG. 9 after an annular via is formed.

Referring to FIG. 10, the initial dielectric layer 15 (refer to FIG. 9) is patterned until the initial substrate 12 is exposed, and an annular via 140 surrounding the TSV structure 104 is formed, wherein the annular via 140 is provided close to the TSV structure 104.

In some embodiments, the annular via 140 exposes a side surface of the third heat dissipation structure 108. In some other embodiments, the third heat dissipation structure is not formed above, and the annular via 140 exposes a side surface of the initial buffer layer 16. In some embodiments, the initial dielectric layer 15 may be etched through a dry etching process, and the remaining part of the initial dielectric layer 15 is used as the dielectric layer 105.

In addition, in some examples, the annular via 140 may be a closed ring structure disposed around the TSV structure 104. In other examples, the annular via 140 may also include: multiple sub-vias arranged around the TSV structure 104 in sequence, and adjacent sub-vias are separated from each other by the dielectric layer 105. In some other examples, the annular via 140 further may be an unclosed ring disposed around the TSV structure 104.

In the forming the annular via 140, etching treatment further may be performed on the initial buffer layer 16, to remove a part of the initial buffer layer 16 directly above the initial substrate 12 through etching. This helps to reduce a distance between the subsequently formed second heat dissipation structure and TSV structure 104 and further enhance the heat dissipation effect. In addition, a part of the initial buffer layer 16 in the initial substrate 12 further may be removed through etching, to expose a part of a side wall of the initial substrate 12 and facing the TSV structure 104. The remaining part of the initial buffer layer 16 is used as a buffer layer 106, and a top surface of the buffer layer 106 is lower than that of the initial substrate 12. This provides a process basis for formation of the second heat dissipation structure between the subsequently formed first heat dissipation structure and TSV structure 104.

Figure 11:
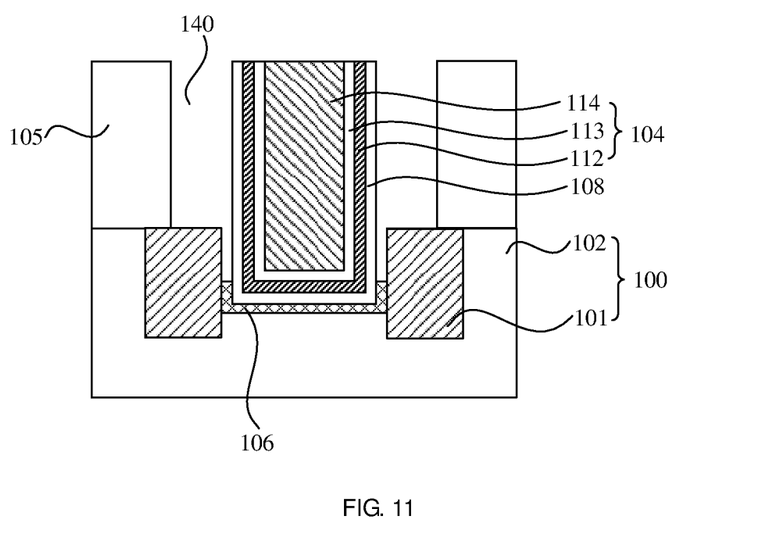
FIG. 11 is a schematic structural diagram of the structure shown in FIG. 10 after a first heat dissipation structure is formed.

Referring to FIG. 11, doping treatment is performed on a part of the initial substrate 12 right below the annular via 140, to convert the part of the initial substrate 12 right below the annular via 140 to the first heat dissipation structure 101, and the remaining part of the initial substrate 12 is used as a substrate 102, wherein a heat conductivity of the first heat dissipation structure 101 is higher than that of the substrate 102.

Forming the first heat dissipation structure 101 may include: performing ion implantation on the part of the initial substrate 12 right below the annular via 140 through an ion implantation process, an ion used in the ion implantation including a carbon ion or a metal ion; and performing annealing treatment, to convert the part of the initial substrate 12 right below the annular via 140 to the first heat dissipation structure 101.

In some embodiments, the TSV structure 104 or the dielectric layer 105 may also be exposed to an ion implantation process environment. Correspondingly, the TSV structure 104 or the dielectric layer 105 may also include a carbon ion or a metal ion.

In some examples, an ion used in the ion implantation is a carbon ion. In some other examples, an ion used in the ion implantation is a metal ion, and the metal ion may be a nickel ion, an aluminum ion, a tungsten ion, or a titanium ion.

In addition, in some embodiments, process parameters of the annealing treatment include: performing annealing in an inert atmosphere such as N2, and an annealing temperature ranges from 400° C. to 800° C.

The substrate 102 and the first heat dissipation structure 101 are formed based on the same initial substrate 12 (refer to FIG. 10), that is, the substrate 102 and the first heat dissipation structure 101 are an integral structure, which helps to avoid an interface defect between the substrate 102 and the first heat dissipation structure 101. In addition, in this embodiment, the buffer layer 106 does not cover a part of a side surface of the first heat dissipation structure 101 and facing the TSV structure 104.

A subsequent process may include: forming a second heat dissipation structure, the second heat dissipation structure at least filling up the annular via 140. The forming the second heat dissipation structure will be described in detail below in conjunction with the drawings.

Figure 12:
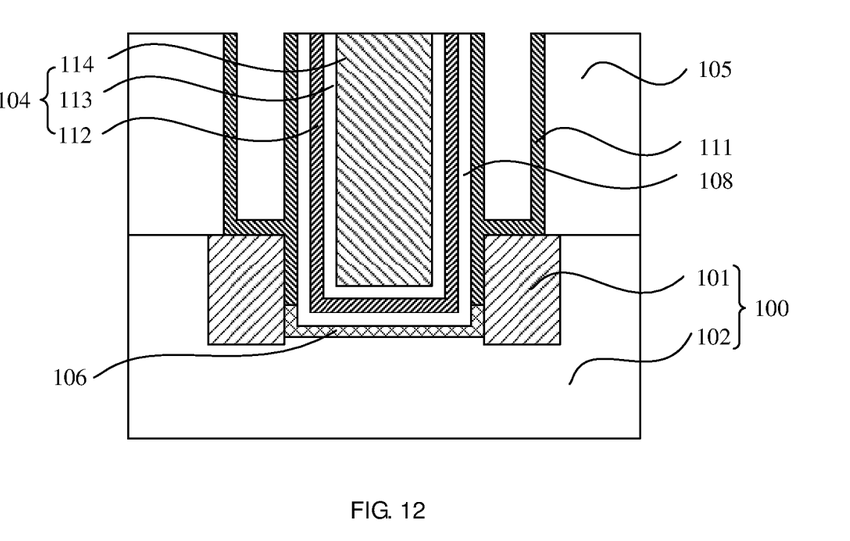
FIG. 12 is a schematic structural diagram of the structure shown in FIG. 11 after a thermally conductive metal layer is formed.

Referring to FIG. 12, a thermally conductive metal layer 111 is formed through a deposition process, wherein the thermally conductive metal layer 111 is located on an upper surface of the first heat dissipation structure 101, a side surface of the dielectric layer 105 and facing the TSV structure 104, and a side surface of the TSV structure 104.

The thermally conductive metal layer 111 may be formed through a chemical vapor deposition process, a physical vapor deposition process, or an atomic layer deposition process. The thermally conductive metal layer 111 is formed through a deposition process, which helps to fill the formed thermally conductive metal layer 111 in an area between the first heat dissipation structure 101 and the TSV structure 104.

Figure 13:
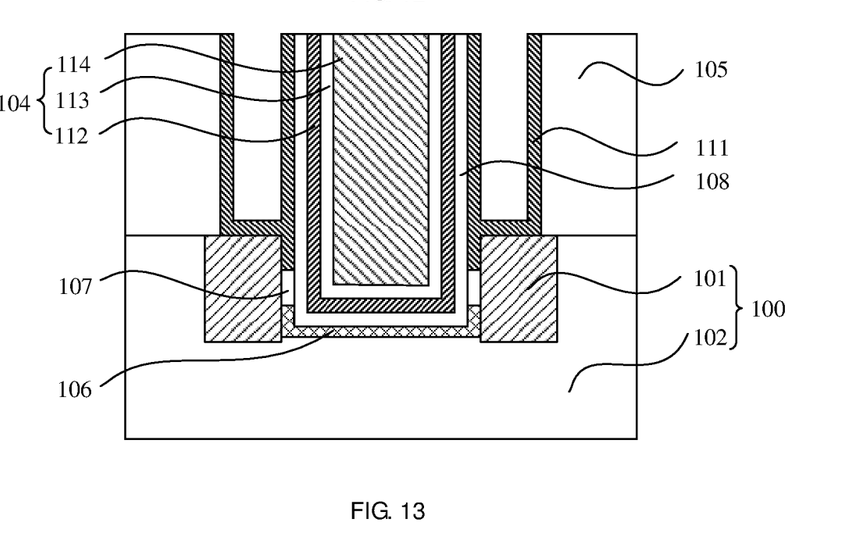
FIG. 13 is a schematic structural diagram of the structure shown in FIG. 12 after a gap is formed.

In some embodiments, as shown in FIG. 12, the thermally conductive metal layer 111 covers an entire side surface of the first heat dissipation structure 101, facing the TSV structure 104, and being not covered by the buffer layer 106. In some other embodiments, as shown in FIG. 13, the thermally conductive metal layer 111 may also not cover a part of a side surface of the first heat dissipation structure 101 and facing the TSV structure 104, and the TSV structure 104, the first heat dissipation structure 101, the buffer layer 106, and the thermally conductive metal layer 111 enclose and form a gap 107.

As shown in FIG. 1 or FIG. 4, the metal particle layer 110 is formed through a spin coating process, and an area enclosed by the thermally conductive metal layer 111 is fully filled with the metal particle layer 110.

In some embodiments, forming the metal particle layer 110 through the spin coating process can not only increase the formation rate of the metal particle layer 110, but also can avoid a void in the metal particle layer 110 caused by premature sealing and improve a hole filling ability of filling the formed metal particle layer 110 in the area enclosed by the thermally conductive metal layer 111, thereby further improving the heat dissipation effect of the metal particle layer 110.

In some embodiments, a particle size of a material of the metal particle layer 110 may be larger than that of a material of the thermally conductive metal layer 111.

It can be understood that, in other embodiments, a single film layer may also be used as the second heat dissipation structure.

In the method of manufacturing a semiconductor structure provided in this embodiment, doping treatment is performed on a part of the initial substrate 12 around the TSV structure 104, to convert a part of the initial substrate 12 to the first heat dissipation structure 101 with higher heat conductivity. In addition, the second heat dissipation structure 103 disposed around the TSV structure 104 is formed right above the first heat dissipation structure 101. The first heat dissipation structure 101 and the second heat dissipation structure 103 can dissipate heat in the TSV structure 104 in time, to avoid heat accumulation in the TSV structure 104, thereby improving the heat dissipation effect of the semiconductor structure.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation" and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing a plurality of steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor structure and the manufacturing method thereof provided in the embodiments of the present disclosure, the substrate includes the first heat dissipation structure whose heat conductivity is higher than that of the substrate, and the first heat dissipation structure surrounds the TSV structure, so that heat of a part of the TSV structure located in the substrate can be dissipated through the first heat dissipation structure. In addition, the upper surface of the first heat dissipation structure is provided with the second heat dissipation structure, and the second heat dissipation structure surrounds the TSV structure, so that heat of a part of the TSV structure protruding above the substrate can be dissipated through the second heat dissipation structure. That is, in the present disclosure, heat of the TSV structure can be dissipated through the first heat dissipation structure and the second heat dissipation structure, to prevent the TSV structure from overheating, increase the heat dissipation rate of the semiconductor structure, and improve reliability and stability of the semiconductor structure.

The invention claimed is:

1. A semiconductor structure, comprising:
a base, the base comprising a substrate and a first heat dissipation structure located in the substrate, a heat conductivity of the first heat dissipation structure being higher than a heat conductivity of the substrate, the substrate comprising an upper surface and a lower surface opposite to each other, and a surface of the first heat dissipation structure being exposed on the upper surface of the substrate;
a second heat dissipation structure, the second heat dissipation structure being at least located on an upper surface of the first heat dissipation structure;
a through silicon via structure, the through silicon via structure penetrating through an entire thickness of the second heat dissipation structure and extending into the base, the second heat dissipation structure surrounding the through silicon via structure, and the first heat dissipation structure surrounding the through silicon via structure;
a dielectric layer, the dielectric layer being located on the upper surface of the substrate; and
a buffer layer, the buffer layer being at least located on a bottom surface of the through silicon via structure facing the lower surface of the substrate.

2. The semiconductor structure according to claim 1, wherein the second heat dissipation structure is further located between the first heat dissipation structure and the through silicon via structure.

3. The semiconductor structure according to claim 1, wherein the buffer layer does not cover a side surface of the first heat dissipation structure facing the through silicon via structure, and the second heat dissipation structure comprises:
a thermally conductive metal layer, the thermally conductive metal layer being located on the upper surface of the first heat dissipation structure, a side surface of the dielectric layer facing the through silicon via structure, and a side surface of the through silicon via structure, and the thermally conductive metal layer being further located on at least a part of the side surface of the first heat dissipation structure facing the through silicon via structure and being not covered by the buffer layer; and
a metal particle layer, the metal particle layer fully filling an area enclosed by the thermally conductive metal layer.

4. The semiconductor structure according to claim 3, wherein the through silicon via structure, the first heat dissipation structure, and the buffer layer enclose and form a hollow area, and the thermally conductive metal layer fully fills the hollow area.

5. The semiconductor structure according to claim 3, wherein the thermally conductive metal layer does not cover a part of the side surface of the first heat dissipation structure facing the through silicon via structure, and the through silicon via structure, the first heat dissipation structure, the buffer layer, and the thermally conductive metal layer enclose and form a gap.

6. The semiconductor structure according to claim 1, wherein the second heat dissipation structure is a single-film-layer structure.

7. The semiconductor structure according to claim 1, wherein a material of the second heat dissipation structure comprises at least one of W, Ag, Au, Pt, Al, Co, Ni, or Ru.

8. The semiconductor structure according to claim 1, wherein the first heat dissipation structure and the substrate comprise a same semiconductor element.

9. The semiconductor structure according to claim 1, wherein a material of the first heat dissipation structure comprises a silicon carbide or a metal silicide.

10. The semiconductor structure according to claim 9, wherein a metal element of the metal silicide comprises Ni, Al, W, or Ti.

11. The semiconductor structure according to claim 1, further comprising: a third heat dissipation structure, the third heat dissipation structure is located on a side surface of the through silicon via structure, and a heat conductivity of a material of the third heat dissipation structure is higher than a heat conductivity of a material of the through silicon via structure.

12. The semiconductor structure according to claim 11, wherein the material of the third heat dissipation structure comprises at least one of TiN, W, Ag, Au, Pt, Al, Co, Ni, or Ru.

13. The semiconductor structure according to claim 1, wherein the through silicon via structure comprises:
- a conductor layer, the conductor layer penetrating through the entire thickness of the second heat dissipation structure and extending into the base;
- a seed layer, the seed layer being located on a side surface and a bottom surface of the conductor layer; and
- a barrier layer, the barrier layer being located on a surface of the seed layer away from the conductor layer.

14. The semiconductor structure according to claim 8, wherein a material of the first heat dissipation structure comprises a silicon carbide or a metal silicide.

* * * * *